United States Patent
Kim et al.

(10) Patent No.: US 10,700,060 B2
(45) Date of Patent: Jun. 30, 2020

(54) E-FUSE FOR USE IN SEMICONDUCTOR DEVICE

(71) Applicants: SK hynix Inc., Gyeonggi-do (KR); INDUSTRY-ACADEMIA COOPERATION GROUP OF SEJONG UNIVERSITY, Seoul (KR)

(72) Inventors: Deok-kee Kim, Seoul (KR); Honggyun Kim, Seoul (KR); Jae Hong Kim, Gyeonggi-do (KR); Seo Woo Nam, Gyeonggi-do (KR)

(73) Assignees: SK hynix Inc., Gyeonggi-do (KR); INDUSTRY-ACADEMIA COOPERATION GROUP OF SEJONG UNIVERSITY, Seoul (KR)

( * ) Notice: Subject to any disclaimer, the term of this patent is extended or adjusted under 35 U.S.C. 154(b) by 0 days.

(21) Appl. No.: 16/671,596

(22) Filed: Nov. 1, 2019

(65) Prior Publication Data

US 2020/0066717 A1 Feb. 27, 2020

Related U.S. Application Data

(62) Division of application No. 15/896,647, filed on Feb. 14, 2018.

(30) Foreign Application Priority Data

Sep. 18, 2017 (KR) .................. 10-2017-0119313

(51) Int. Cl.
*H01L 27/07* (2006.01)
*H01L 23/525* (2006.01)

(52) U.S. Cl.
CPC ...... *H01L 27/0738* (2013.01); *H01L 23/5256* (2013.01)

(58) Field of Classification Search
None
See application file for complete search history.

(56) References Cited

U.S. PATENT DOCUMENTS

| | | | | |
|---|---|---|---|---|
| 8,143,695 B1* | 3/2012 | Ang | ..................... | H01L 23/5256 257/528 |
| 2011/0018091 A1* | 1/2011 | Barth | .................. | H01L 23/5256 257/529 |
| 2011/0272764 A1* | 11/2011 | Kim | ..................... | H01L 23/5252 257/368 |
| 2018/0190804 A1* | 7/2018 | Chui | .................. | H01L 29/0673 |

* cited by examiner

*Primary Examiner* — Nilufa Rahim
(74) *Attorney, Agent, or Firm* — IP & T Group LLP

(57) ABSTRACT

An e-fuse for a semiconductor device includes first and second electrodes; a gate metal electrically coupling the first and second electrodes with each other; a semiconductor layer formed under the gate metal, and forming a capacitor together with the gate metal; and a first oxide layer formed under the gate metal and on both sides of the semiconductor layer.

3 Claims, 9 Drawing Sheets

E-FUSE FOR USE IN SEMICONDUCTOR DEVICE

CROSS-REFERENCES TO RELATED APPLICATION

This application is a division of U.S. patent application Ser. No. 15/896,647 filed on Feb. 14, 2018, which claims priority of Korean Patent Application No. 10-2017-0119313, filed on Sep. 18, 2017. The disclosure of each of the foregoing applications is incorporated herein by reference in its entirety.

BACKGROUND

1. Technical Field

Various embodiments generally relate to an e-fuse for use in a semiconductor device and a semiconductor device comprising the same.

2. Related Art

In general, semiconductor device fuses are used to achieve various purposes in the field of semiconductor technology. For example, fuses may be used in a repair process in which a failed memory cell is replaced with a redundancy memory cell, and may be used in a constant voltage generation circuit which tunes a voltage or a control circuit for selecting various modes and testing.

Such fuses may be divided into laser fuses and e-fuses depending on a cutting method. Between them, the e-fuses use a method of selectively cutting them by using current. Meanwhile, one of the requirements for improved fuse technology is to reduce the fuse area. In this regard, since a selection element provides program current and occupies most of the fuse area, it may be required a technique for lowering program current affecting the size of the selection element to thereby reduce the fuse area.

SUMMARY

Various embodiments are directed to an e-fuse for use in a semiconductor device capable of being blown with low program current, thereby improving performance and reducing a fuse area.

In an embodiment, an e-fuse for use in a semiconductor device may include: first and second electrodes; a gate metal electrically coupling the first and second electrodes with each other; a semiconductor layer formed under the gate metal, and forming a capacitor together with the gate metal; and a first oxide layer formed under the gate metal on both sides of the semiconductor layer.

In an embodiment, an e-fuse for use in a semiconductor device may include: first and second electrodes; a gate metal electrically coupling the first and second electrodes with each other; a semiconductor layer formed under the gate metal forming a capacitor together with the gate metal; and a first oxide layer formed under the gate metal and on both sides of the semiconductor layer, wherein the gate metal includes a first gate metal extending from the first electrode and a second gate metal extending from the second electrode to be brought into contact with the first gate metal, and wherein the first and second gate metals are formed of different metals.

In an embodiment, A semiconductor device comprising at least one e-fuse, the e-fuse comprising: first and second electrodes; a gate metal electrically coupling the first and second electrodes; a semiconductor layer formed under the gate metal, and forming a capacitor together with the gate metal; and a first oxide layer formed under the gate metal on both sides of the semiconductor layer.

According to the embodiments, since a capacitance characteristic may be changed by applying relatively low program current, it is possible to improve the performance of the e-fuse.

Further, since an e-fuse may be blown with low program current, it is possible to reduce an area per bit of the e-fuse.

DETAILED DESCRIPTION

Figure 1:
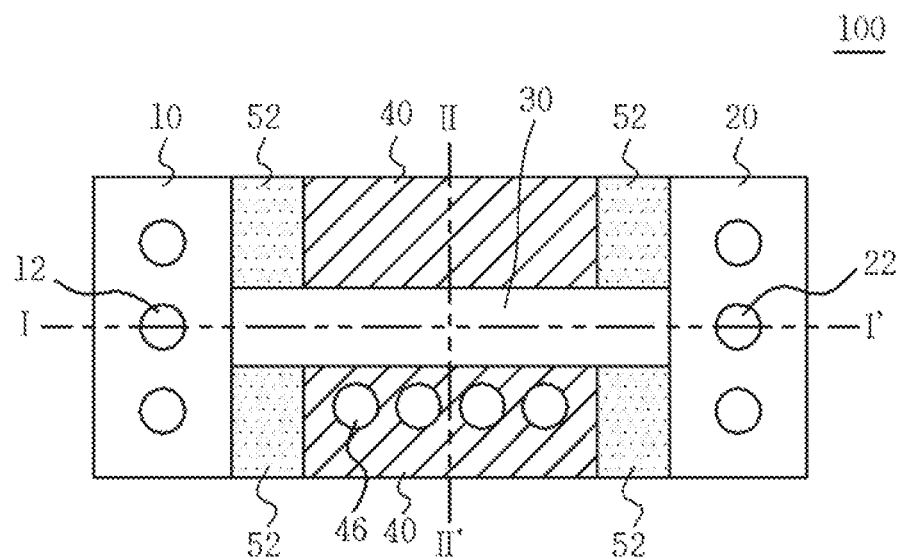
FIG. 1 is a top view to assist in the explanation of an e-fuse for use in a semiconductor device in accordance with a first embodiment of the present disclosure.

Hereinafter, various embodiments will be described in detail with reference to the accompanying drawings to the extent that a person skilled in the art to which the embodiments pertain may easily enforce the embodiments. Among the reference numerals presented in the drawings, like reference numerals denote like members.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

In the following embodiments, an n-type metal may be defined as a metal which is used in an NMOS (n-type metal oxide semiconductor) transistor, and a p-type metal may be defined as a metal which is used in a PMOS (p-type metal oxide semiconductor) transistor.

FIG. 1 is a top view to assist in the explanation of an e-fuse for a semiconductor device in accordance with a first embodiment of the present disclosure.

Referring to FIG. 1, an e-fuse 100 of a semiconductor device includes first and second electrodes 10 and 20, a gate metal 30, a semiconductor layer 40, and a first oxide layer 52.

The first electrode 10 may be referred to as a cathode, and the second electrode 20 may be referred to as an anode. Contacts 12 and 22 for applying a program voltage may be formed on the first and second electrodes 10 and 20. Programming the e-fuse may include applying a program voltage to any one of the first and second electrodes 10 and 20 and applying a ground voltage to the semiconductor layer 40.

The gate metal 30 has a structure which electrically couples the first and second electrodes 10 and 20 between the first and second electrodes 10 and 20, and is formed of a material capable of being electrically programmed. For instance, the gate metal 30 may be formed of an n-type metal or a p-type metal used in an NMOS or a PMOS. The gate metal 30 may be formed of a metallic material such as Al or may be formed of layers of TiN, Ti, Al and AlTiO. The gate metal 30 may be formed integrally with the first electrode 10 and the second electrode 20. The gate metal may have the shape of an elongated bar extending in a first direction I-I'. The first and second electrodes 10 and 20 may each have the shape of an elongated bar extending in a second direction II-II'. The second direction may be perpendicular to the first direction.

The semiconductor layer 40 is formed under the gate metal with a gate oxide layer 60 disposed therebetween. The semiconductor layer 40 may have a smaller length in the first direction I-I' than the gate metal 30. The semiconductor layer 40, the gate oxide layer 60 and the gate metal 30 may form an n-type or a p-type capacitor. In the case where the semiconductor layer 40 the gate oxide layer 60 and the gate metal 30 form an n-type capacitor, the program voltage may be applied to the second electrode 20 and the ground voltage may be applied to the semiconductor layer 40. In the case where the semiconductor layer 40, the gate oxide layer, and the gate metal 30 form a p-type capacitor, the program voltage may be applied to the first electrode 10 and the ground voltage may be applied to the semiconductor layer 40. One or more contacts 46 for applying the ground voltage are formed on the semiconductor layer 40.

The first oxide layer 52 may be formed on both sides of the semiconductor layer 40 and at the same level as the semiconductor layer 40. The first oxide layer may overlap with the first and second electrodes 10 and 20 and side portions of the gate metal 30. As such, the e-fuse 100 of a semiconductor device includes the first and second electrodes 10 and 20 for applying the program voltage, the gate metal 30 which electrically couples the first and second electrodes 10 and 20, the semiconductor layer 40 which is formed under the gate metal 30 and forms the capacitor together with the gate metal 30, the first oxide layer 52 which is formed on both sides of the semiconductor layer 40 to the bottoms of the first and second electrodes 10 and 20, and a gate oxide layer 60 disposed below the gate metal 30, and the first and second electrodes 10 and 20 and above the first oxide layer 52 and the semiconductor layer 40.

In the e-fuse 100 of a semiconductor device configured as mentioned above, when a program voltage is applied to any one of the first and second electrodes 10 and 20, resistive heat may be induced in the gate metal 30. The resistive heat may have a nonuniform temperature distribution in the gate metal 30. The nonuniform temperature distribution in the gate metal 30 may have a highest temperature at the center portion of the gate metal 30. The nonuniform temperature distribution may induce the thermo-migration of atoms in the gate metal 30. The thermo-migration may include a thermo-migration in which atoms migrate in an anode direction from the center portion of the gate metal 30 and a thermo-migration in which atoms migrate in a cathode direction from the center portion of the gate metal 30. As a result, the dielectric constant characteristic of the gate oxide layer 60 may change and a breakdown may occur in the gate oxide layer 60.

Also, in the e-fuse 100 of a semiconductor device, electro-migration, thermo-migration and melting phenomena may be induced in the gate metal 30 by the program current. As a result, the gate metal 30 may be blown. A driving force by the electro-migration induced in the gate metal 30 may be changed by changing the sectional area of the gate metal 30. While it is illustrated in FIG. 1 that the gate metal 30 has the same sectional area between the first and second electrodes 10 and 20 and extends in one direction, this is only for the sake of convenience in explanation, and it is to be noted that the embodiment is not limited thereto. The gate metal 30 may include a bent portion in correspondence to the positions of the first and second electrodes 10 and 20, and may be formed to have a different sectional area. The bent portion or the variable sectional area may have an advantage of enabling the blowing of the gate metal 30 by a lower program current.

In this way, if a program current flows through the gate metal 30, electro-migration thermo-migration and melting phenomena are induced in the gate metal 30, and a driving force by the electro-migration, thermo-migration and melting phenomena blows the gate metal 30. If the gate metal 30 is blown, the capacitance value significantly changes before and after the programming. As a consequence, the performance of the e use 100 may be improved since a high on/off ratio is possible due to the many more changes occurring when compared to the case of using only a metal line, and an area per bit of the e-fuse 100 may be reduced since programming is possible with low current.

Figure 2:
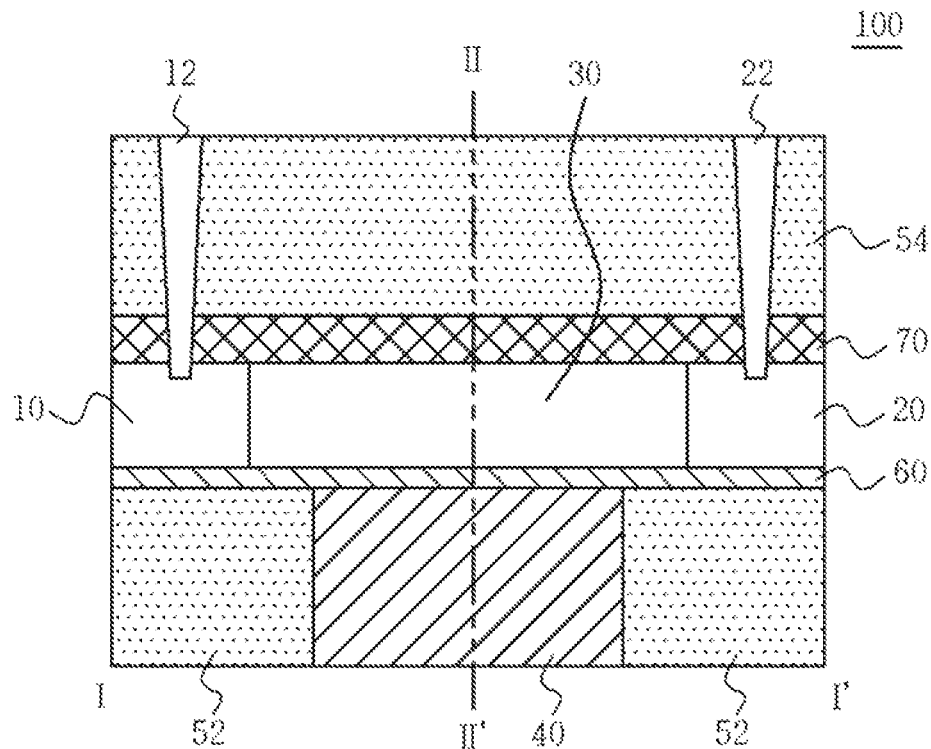
FIG. 2 is a cross-sectional view taken along the line I-I' of FIG. 1.

A silicon nitride layer 70 and a second oxide layer 54 shown in FIG. 2 are not shown in the top view of FIG. 1 to facilitate the understanding of the structure of the present embodiment. As shown in FIG. 2, the silicon nitride layer 70 may be formed on the gate metal 30 and the first and second electrodes 10 and 20, and the second oxide layer 54 may be formed on the silicon nitride layer 70, the semiconductor layer 40 and the first oxide layer 52.

FIG. 2 is a cross-sectional view taken along the line I-I' of FIG. 1.

Referring to FIG. 2, the e-fuse 100 of a semiconductor device includes the semiconductor layer 40, the first oxide layer 52 which is formed on both sides of the semiconductor layer 40, the gate metal 30 which couples the first and second electrodes 10 and 20 and the gate oxide layer 60. The gate oxide layer 60 is formed between the bottom end of the gate metal 30 and the top end of the semiconductor layer 40 corresponding to the bottom end of the gate metal 30. The gate oxide layer 60 is also formed between the bottom end of the gate metal 30 and the top end of the first oxide layer 52 corresponding to the bottom end of the gate metal 30. The gate oxide layer 60 is also formed between the bottom end of the first and second electrodes 10 and 20 and the top end of the first oxide layer 52 corresponding to the bottom end of the first and second electrodes 10 and 20. The gate oxide layer 60 may react with the gate metal 30 or be changed in its dielectric constant characteristic due to a high temperature during a program operation. For instance, the gate oxide layer 60 may be formed of $HfO_2$.

The silicon nitride layer 70 may be formed on the gate metal 30 and the first and second electrodes 10 and 20, and the second oxide layer 54 is formed on the silicon nitride layer 70. For instance, the silicon nitride layer 70 may be formed of SiN or SiCN.

Figure 3:
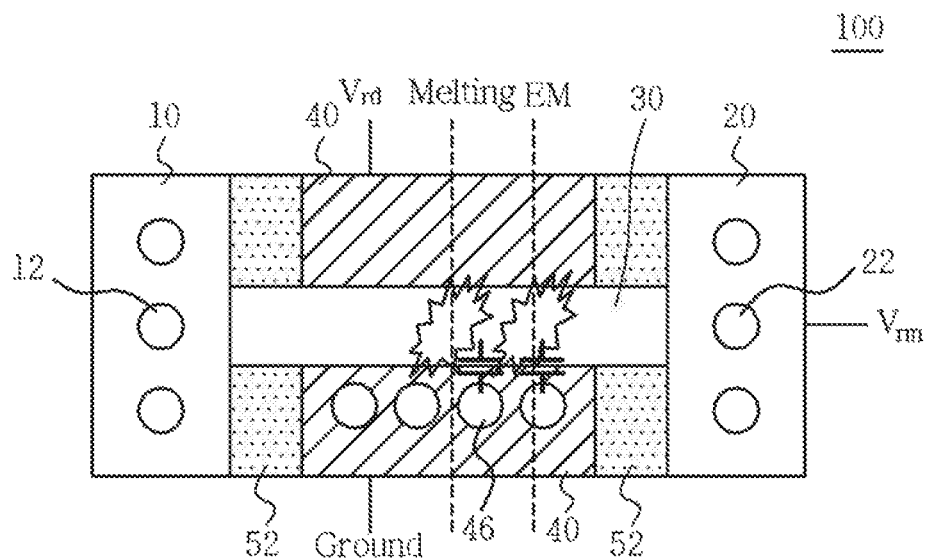
FIG. 3 is a view to assist in the explanation of the change of capacitance when programming the e-fuse.
Figure 4:
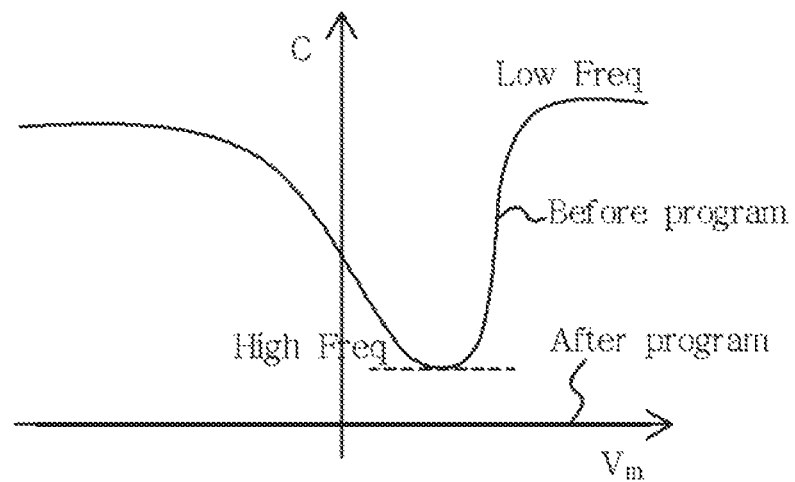
FIG. 4 is a graph to assist in the explanation of the change of the capacitance before and after program.

FIG. 3 is a view to assist in the explanation of the change of capacitance when programming the e-fuse. FIG. 4 is a graph to assist in the explanation of the change of the capacitance before and after programming. For instance, FIGS. 3 and 4 exemplify a case where the gate metal 30 and the semiconductor layer 40 are formed into an NMOS type capacitor, and the program voltage is applied to the second electrode 20 and the ground voltage is applied to the semiconductor layer 40.

Referring to FIGS. 3 and 4, in the e-fuse 100 of a semiconductor device, when a program voltage is applied to the second electrode 20, electro-migration thermo-migration and melting phenomena are induced in the gate metal 30. As a result, as the gate metal 30 and the gate oxide layer 60 react with each other or the dielectric constant characteristic of the gate oxide layer 60 changes, a void may occur in the gate metal 30.

In the case where fusing proceeds in a state where a current density is relatively high in the programming of the e-fuse 100, a void is formed in the center of the gate metal 30 as the gate metal 30 is melted. In the case where fusing proceeds in a state where a current density is relatively low in the programming of the e-fuse 100, a void is formed in a portion of the gate metal 30 that is closer to the second electrode 20 as the electro-migration and thermo-migration proceed.

In this regard, the capacitance value change significantly and show a large difference before and after the programming because of one or more of the following phenomena.

First, in the case where the characteristic of the gate oxide layer 60 changes by heat or the gate oxide layer 60 and the gate metal 30 react with each other, the dielectric constant of the gate oxide layer changes and the capacitance value changes.

Also, if the gate metal 30 is cut, the capacitance value decreases as the area of the gate metal 30 decreases, and is changed as the thickness of the gate oxide layer 60 changes by heat.

Further, if the gate oxide layer 60 breaks down by excessive current in the programming of the gate metal 30, the capacitance value approaches 0.

In this way, in the e-fuse 100, the capacitance value changes due to changes in the dielectric constant of the capacitor, the area, a distance and so forth, depending on whether the program is performed or not.

Figure 5:
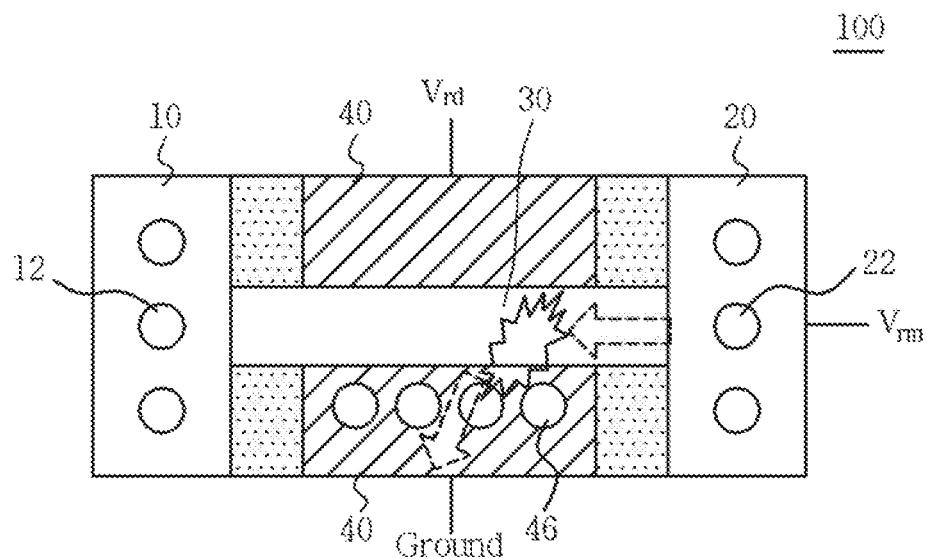
FIGS. 5 and 6 are a view and a graph to assist in the explanation of leakage current according to the programming of the e-fuse.
Figure 6:
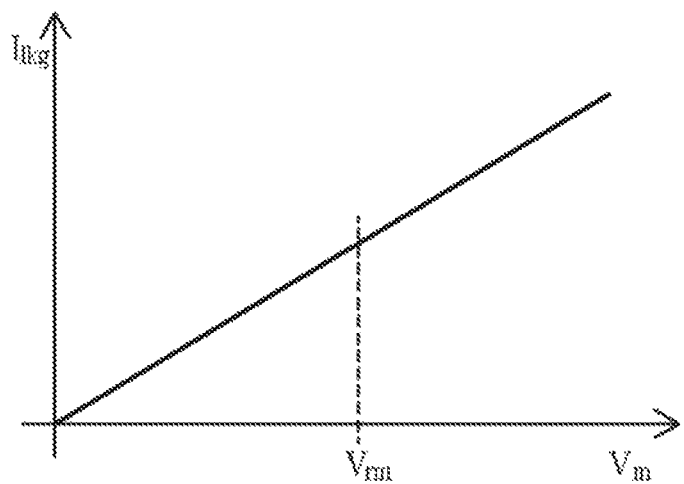

FIGS. 5 and 6 are representations of examples of a view and a graph to assist in the explanation of leakage current according to the programming of the e-fuse.

Referring to FIGS. 5 and 6, in the e-fuse 100, when a program voltage is applied to the second electrode 20 and the ground voltage is applied to the semiconductor layer 40, electro-migration, thermo-migration, and melting phenomena are induced in the gate metal 30. As a result, as the gate metal 30 and the gate oxide layer 60 react with each other or the dielectric constant characteristic of the gate oxide layer 60 changes, and the gate oxide layer 60 may break down.

The leakage current of the capacitor between the second electrode 20 and the semiconductor layer 40 increases by the breakdown of the gate oxide layer 60. In this way, in the e-fuse 100, leakage current increases due to the changes in the characteristics of the gate metal 30 and the gate oxide layer 60 and the breakdown of the gate oxide layer 60, depending on whether the program is performed or not.

Figure 7:
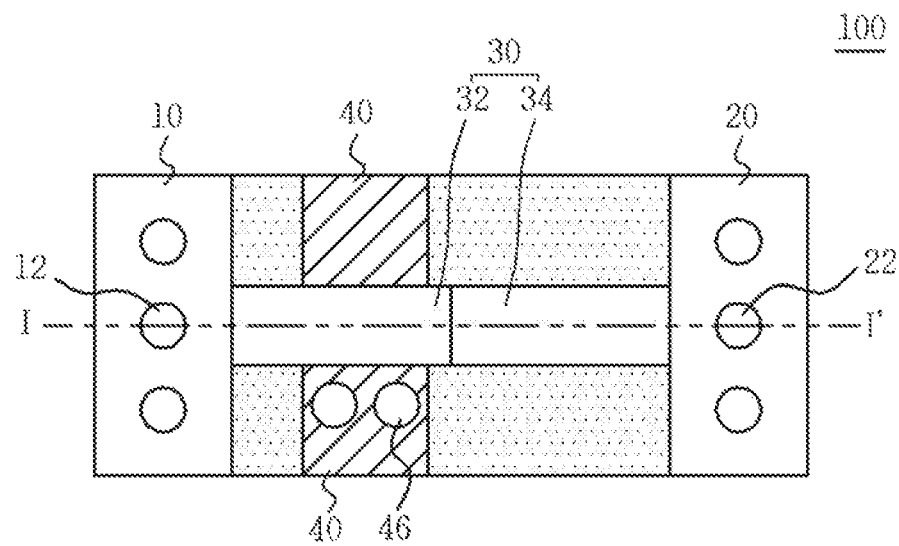
FIG. 7 is a top view to assist in the explanation of an e-fuse for use in a semiconductor device in accordance with a second embodiment of the present disclosure.
Figure 8:
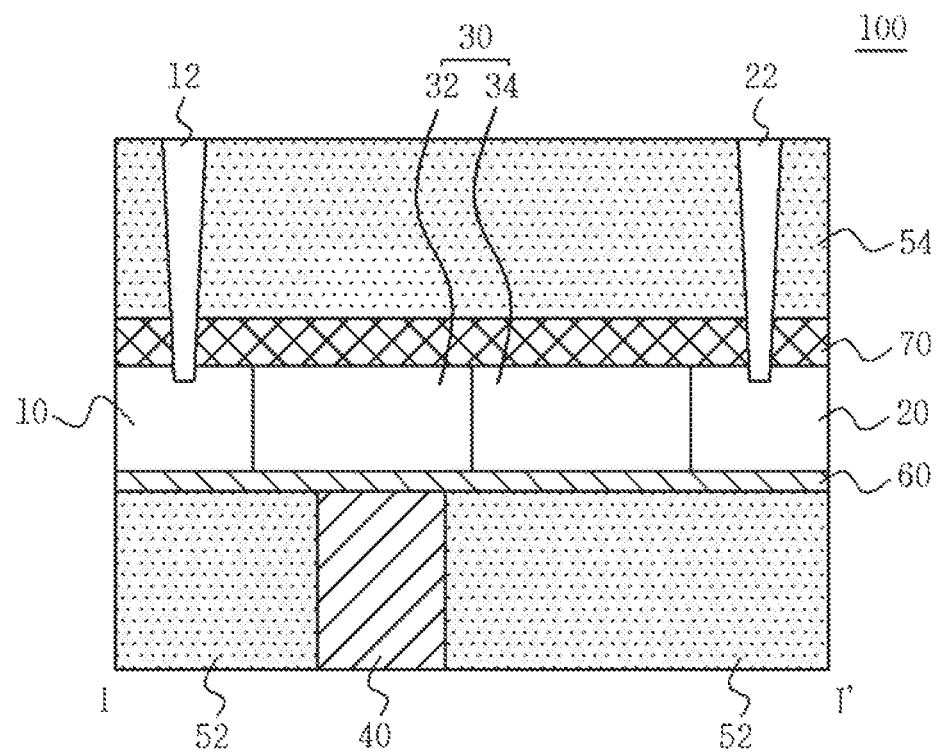
FIG. 8 is a cross-sectional view taken along the line of FIG. 7.

FIG. 7 is a top view to assist in the explanation of an e-fuse 100 of a semiconductor device in accordance with a second embodiment of the present disclosure. FIG. 8 is a cross-sectional view taken along the line I-I' of FIG. 7. A silicon nitride layer 70 and a second oxide layer 54 shown in FIG. 8 are not shown in the top view of FIG. 7 to facilitate the understanding of the structure of the present embodiment. As shown in FIG. 8, the silicon nitride layer 70 may be formed on a gate metal 30 and first and second electrodes 10 and 20, and the second oxide layer 54 may be formed on the silicon nitride layer 70, the semiconductor layer 40 and the first oxide layer 52.

Referring to FIGS. 7 and 8, the e-fuse 100 includes the first and second electrodes 10 and 20, the gate metal 30, the semiconductor layer 40, the first oxide layer 52, and the gate oxide layer 60.

The gate metal 30 which couples the first and second electrodes 10 and 20 includes a first gate metal 32 which extends from the first electrode 10 toward the second electrode 20 and a second gate metal 34 which extends from the second electrode 20 toward the first electrode 10. The first and second gate metals 32 and 34 may be formed of the same metal, and may be formed integrally with the first electrode 10 and the second electrode 20. The first and second gate metals 32 and 34 may be formed of one or more metallic materials. The dimensions of the first and second gate metals 32 and 34 may be substantially the same as illustrated in FIG. 7.

The gate oxide layer 60 is formed under the first and second electrodes 10, 20 and the first and second gate metals 32 and 34. The semiconductor layer 40 is formed under the first gate metal 32 with the gate oxide layer 60 disposed between the first gate metal 32 and the semiconductor layer 40. The semiconductor layer 40 the gate oxide layer 60 and the first gate metal 32 form an n-type capacitor. In the programming of the e-fuse 100, a program voltage may be applied to the second electrode 20, and a ground voltage may be applied to the semiconductor layer 40. One or more contacts 46 for applying the ground voltage are formed on the semiconductor layer 40.

The first oxide layer 52 is formed under the second gate metal 34, and is formed on both sides of the semiconductor layer 40 at the same level as the semiconductor layer 40. The first oxide layer 52 overlaps with the second gate metal 34, and the first and second electrodes 10 and 20. The first oxide layer 52 overlaps partially with side parts of the first gate metal 32.

When a program voltage is applied to the second electrode 20, electro-migration, thermo-migration and melting phenomena are induced in the gate metal 30 by the program current, and the e-fuse 100 uses a change in capacitance or leakage current according to changes in the dielectric constant characteristics of the gate metal 30 and the gate oxide layer 60.

Figure 9:
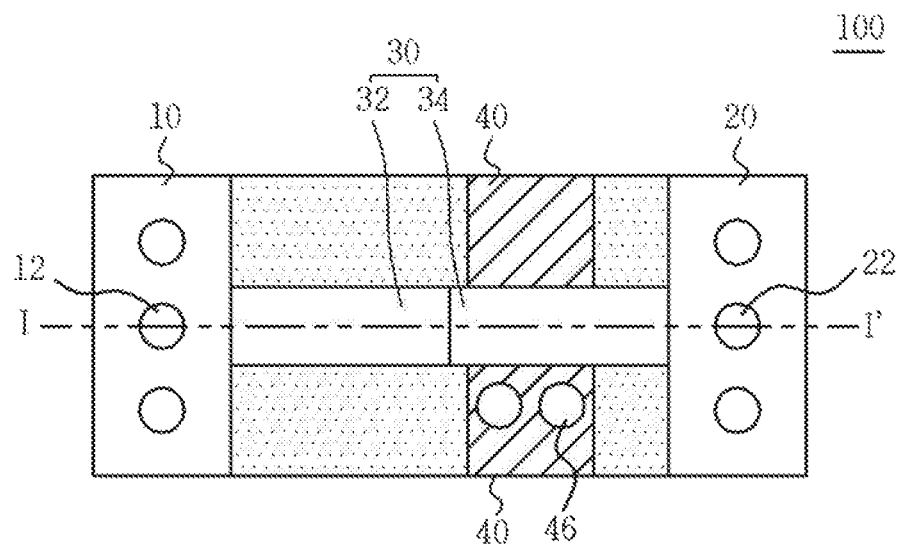
FIG. 9 is a top view to assist in the explanation of an e-fuse for use in a semiconductor device in accordance with a third embodiment of the present disclosure.
Figure 10:
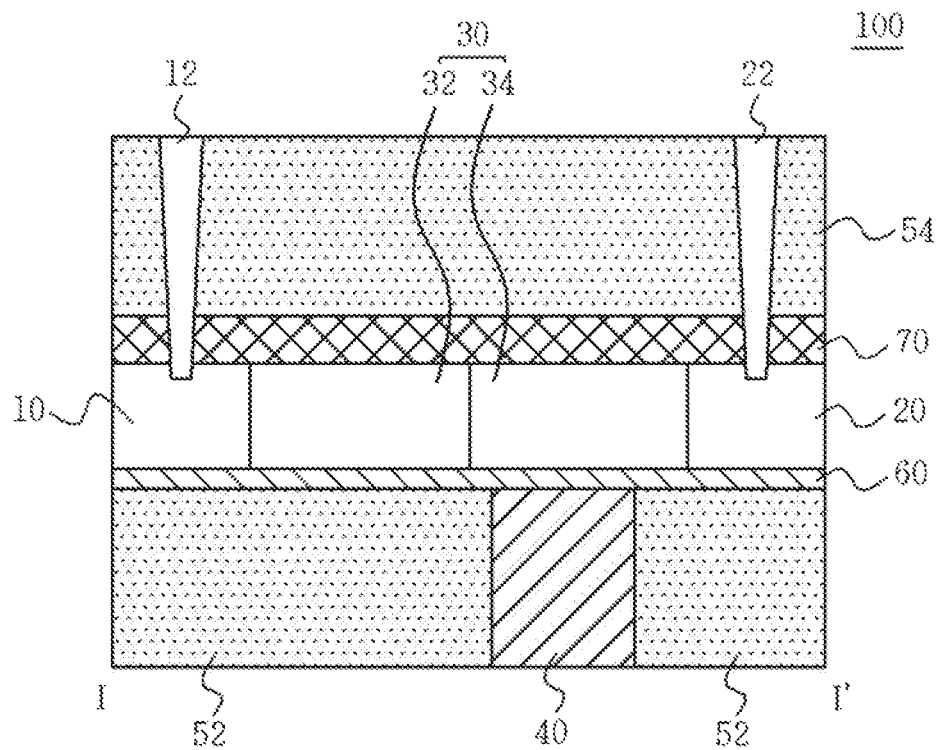
FIG. 10 is a cross-sectional view taken along the line I-I of FIG. 9.

FIG. 9 is a top view to assist in the explanation of an e-fuse 100 of a semiconductor device in accordance with a third embodiment of the present disclosure. FIG. 10 is a cross-sectional view taken along the line I-I' of FIG. 9. A silicon nitride layer 70 and a second oxide layer 54 shown in FIG. 10 are not shown in the top view of FIG. 9 to facilitate the understanding of the structure of the present embodiment. As shown in FIG. 10, the silicon nitride layer 70 may be formed on a gate metal 30 and first and second electrodes 10 and 20, and the second oxide layer 54 may be formed on the silicon nitride layer 70, the semiconductor layer 40 and the first oxide layer 52.

Referring to FIGS. 9 and 10, the e-fuse 100 includes the first and second electrodes 10 and 20, the gate metal 30, the semiconductor layer 40, the first oxide layer 52, and the gate oxide layer CO.

The gate metal 30 which couples the first and second electrodes 10 and 20 includes a first gate metal 32 which extends from the first electrode 10 toward the second electrode 20 and a second gate metal 34 which extends from the second electrode 20 toward the first electrode 10. The first and second gate metals 32 and 34 may be formed of the same metal, and may be formed integrally with the first electrode 10 and the second electrode 20. The first and second gate metals 32 and 34 may be formed of one or more metallic materials.

The semiconductor layer 40 is formed under the second gate metal 34. The length of the semiconductor layer in the first direction I-I' is smaller than the length of the second metal gate 34 and is positioned substantially centrally below the second metal gate 34. The semiconductor layer 40, the gate oxide layer CO, and the second gate metal 34 form a p-type capacitor. In the programming of the e-fuse 100, a program voltage may be applied to the first electrode 10, and a ground voltage may be applied to the semiconductor layer 40. One or more contacts 46 for applying the ground voltage are formed on the semiconductor layer 40.

The gate oxide layer 60 is formed under the metal gate 30 and the first and second electrodes 10 and 20. The first oxide layer 52 is formed under the gate oxide layer 60 on both sides of the semiconductor layer 40 and at the same level as the semiconductor layer 40. Hence, the first oxide layer 52 overlaps with the first metal gate 32 and the first and second electrodes 10 and 20. The first oxide layer 52 overlaps with side portions of the second metal gate 34.

When a program voltage is applied to the first electrode 10, electro-migration, thermo-migration and melting phenomena are induced in the gate metal 30 by the program current, and the e-fuse 100 uses a change in capacitance or leakage current according to changes in the dielectric constant characteristics of the gate metal 30 and the gate oxide layer 60.

Figure 11:
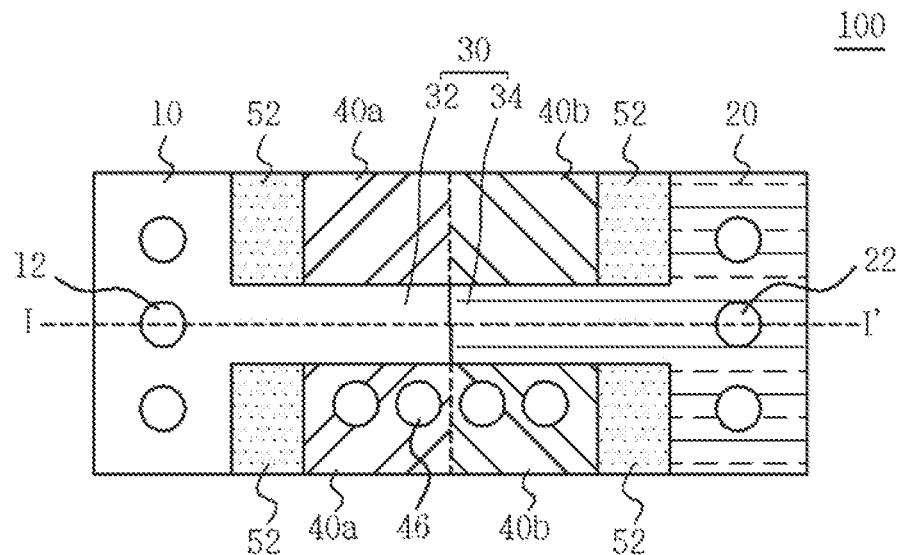
FIG. 11 is a top view to assist in the explanation of an e-fuse for use in a semiconductor device in accordance with a fourth embodiment of the present disclosure.
Figure 12:
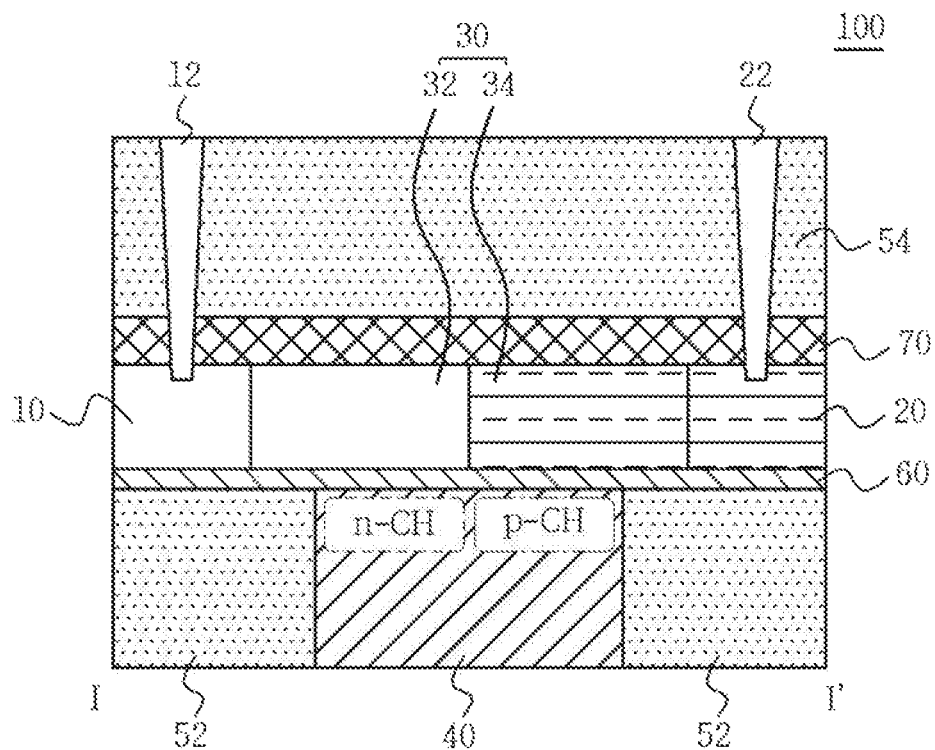
FIG. 12 is a cross-sectional view taken along the line IT of FIG. 11.

FIG. 11 is a top view to assist in the explanation of an e-fuse 100 of a semiconductor device in accordance with a fourth embodiment of the present disclosure. FIG. 12 is a cross-sectional view taken along the line of FIG. 11. A silicon nitride layer 70 and a second oxide layer 54 shown in FIG. 12 are not shown in the top view of FIG. 11 to facilitate the understanding of the structure of the present embodiment. As shown in FIG. 12, the silicon nitride layer 70 may be formed on a gate metal 30 and first and second electrodes 10 and 20, and the second oxide layer 54 may be formed on the silicon nitride layer 70, a semiconductor layer 40 and a first oxide layer 52.

Referring to FIGS. 11 and 12, the e-fuse 100 includes the first and second electrodes 10 and 20, the gate metal 30, the semiconductor layer 40, the gate oxide layer 60, and the first oxide layer 52.

The first electrode 10 may be referred to as a cathode, and the second electrode 20 may be referred to as an anode. Contacts 12 and 22 for applying a program voltage may be formed on the first and second electrodes 10 and 20. Program includes a process of applying the program voltage to any one of the first and second electrodes 10 and 20 and applying a ground voltage to the semiconductor layer 40.

The gate metal 30 electrically couples the first and second electrodes 10 and 20, and includes a first gate metal 32 which extends from the first electrode 10 toward the second electrode 20 and a second gate metal 34 which extends from the second electrode 20 toward the first electrode 10. The first and second gate metals 32 and 34 may be formed of different metals or may be formed of one or more different metallic materials. For instance, the first gate metal 32 may be formed of a metallic material such as Al, and the second gate metal 34 may be formed of layers of TiN, Ti, Al and AlTiO. Alternatively, the first and second gate metals 32 and 34 may be formed of layers of TiN, Ti, Al and AlTiO which have different specific gravities. The first gate metal 32 may be formed integrally with the first electrode 10, and the second gate metal 34 may be formed integrally with the second electrode 20. The first and second gate metals 32 and 34 may overlap with each other.

The semiconductor layer 40 is formed under the gate oxide layer 60 and is positioned substantially centrally below the gate metal 30. One half of the semiconductor layer 40 is formed into an n-type 40a, and the other half of the semiconductor layer 40 is formed into a p-type 40b. That is, the semiconductor layer 40 and the first gate metal 32 form an n-type capacitor, and the semiconductor layer 40, the gate oxide layer 60, and the second gate metal 34 form a p-type capacitor. An n-type channel n-CH and a p-type channel p-CH may be formed in the semiconductor layer 40, and one or more contacts 46 for applying the ground voltage in the program may be formed on the semiconductor layer 40.

The first oxide layer 52 is formed on both sides of the semiconductor layer 40 and at the same level as the semiconductor layer 40.

The gate oxide layer 60 formed between the bottom end of the gate metal 30 and the top ends of the semiconductor layer 40 and the first oxide layer 52 corresponding to the bottom end of the gate metal 30 may react with the gate metal 30 or be changed in its dielectric constant characteristic due to a high temperature in the program. For instance, the gate oxide layer 60 may be formed of $HfO_2$.

The silicon nitride layer 70 is formed on the gate metal 30 and the first and second electrodes 10 and 20, and the second oxide layer 54 is formed on the silicon nitride layer 70. For instance, the silicon nitride layer 70 may be formed of SiN or SiCN.

As such, the e-fuse 100 includes the first and second electrodes 10 and 20 for applying the program voltage, the first and second gate metals 32 and 34 which electrically couple the first and second electrodes 10 and 20 and are formed of different metals, the semiconductor layer 40 which is formed under the first and second gate metals 32 and 34, and the first oxide layer 52 which is formed on both sides of the semiconductor layer 40, and the gate oxide layer 60.

In the e-fuse 100 configured as mentioned above, when a program voltage is applied to any one of the first and second electrodes 10 and 20, electro-migration, thermo-migration and melting phenomena are induced in the gate metal 30 by program current. As a result, capacitance or leakage current changes according to changes in the dielectric constant characteristics of the gate metal 30 and the gate oxide layer 60 may occur.

Figure 13:
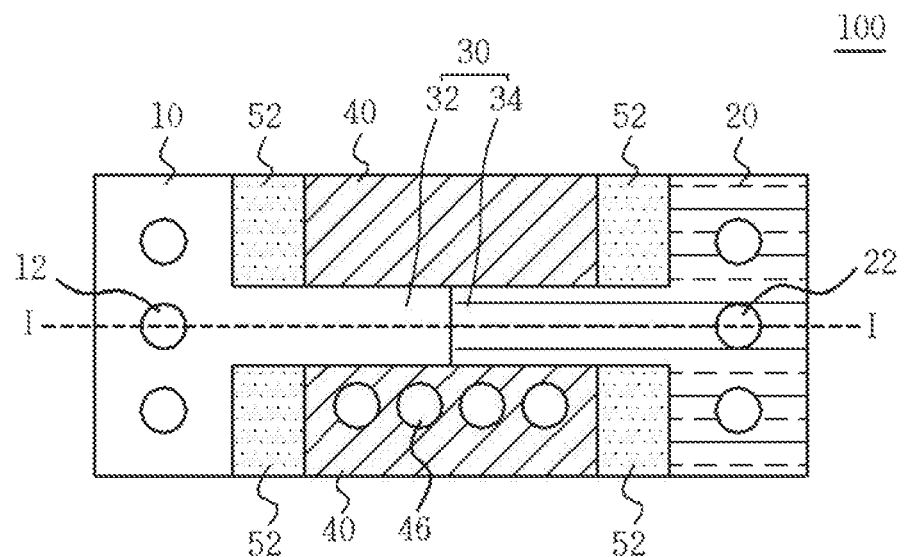
FIG. 13 is a top view to assist in the explanation of an e-fuse for use in a semiconductor device in accordance with a fifth embodiment of the present disclosure.
Figure 14:
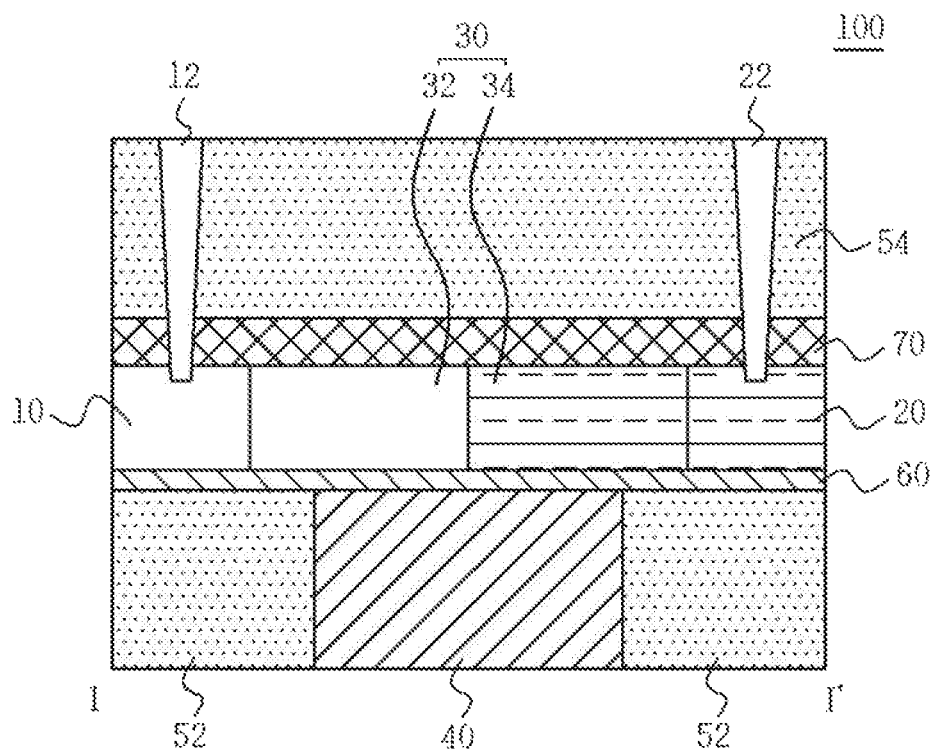
FIG. 14 is a cross-sectional view taken along the line IT of FIG. 13.

FIG. 13 is a top view to assist in the explanation of an e-fuse 100 of a semiconductor device in accordance with a fifth embodiment of the present disclosure. FIG. 14 is a cross-sectional view taken along the line I-I' of FIG. 13. A silicon nitride layer 70 and a second oxide layer 54 shown in FIG. 14 are not shown in the top view of FIG. 13 to facilitate the understanding of the structure of the present embodiment. As shown in FIG. 14, the silicon nitride layer 70 may be formed on a gate metal 30 and first and second electrodes 10 and 20, and the second oxide layer 54 may be formed on the silicon nitride layer 70, a semiconductor layer 40 and a first oxide layer 52.

Referring to FIGS. 13 and 14, the e-fuse 100 includes the first and second electrodes 10 and 20, first and second gate metals 32 and 34 which electrically couple the first and second electrodes 10 and 20 and are formed of different metals, the semiconductor layer 40 which is formed under the first and second gate metals 32 and 34, the first oxide layer 52 which is formed on both sides of the semiconductor layer 40, and the gate oxide layer 60. The first and second gate metals 32 and 34 and the semiconductor layer 40 may form an n-type or a p-type capacitor.

In the e-fuse 100 configured as mentioned above, depending on whether programming is performed or not, the capacitance value changes due to changes in the dielectric constant of a capacitor, an area, a distance and so forth, and also leakage current increases due to the changes in the characteristics of the gate metal 30 and of the gate oxide layer 60, and the breakdown of the gate oxide layer 60.

Figure 15:
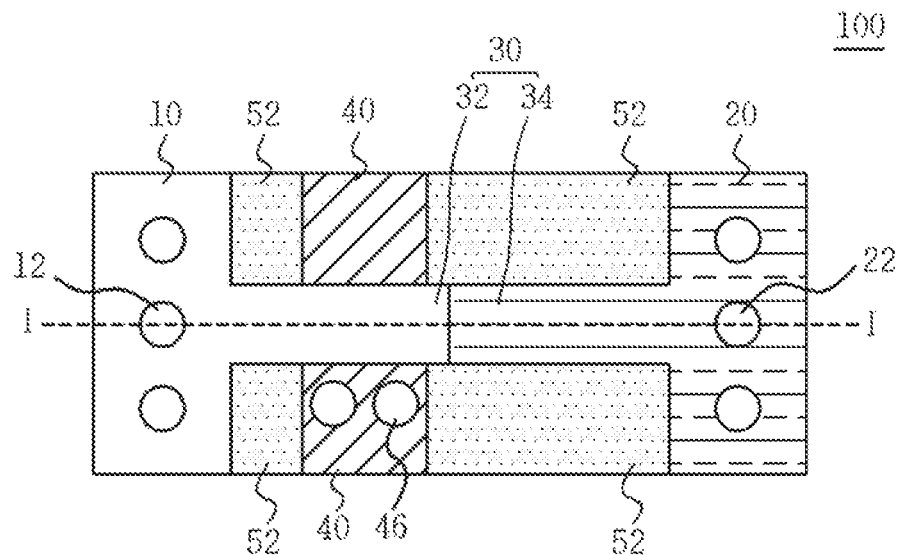
FIG. 15 is a top view to assist in the explanation of an e-fuse for use in a semiconductor device in accordance with a sixth embodiment of the present disclosure.
Figure 16:
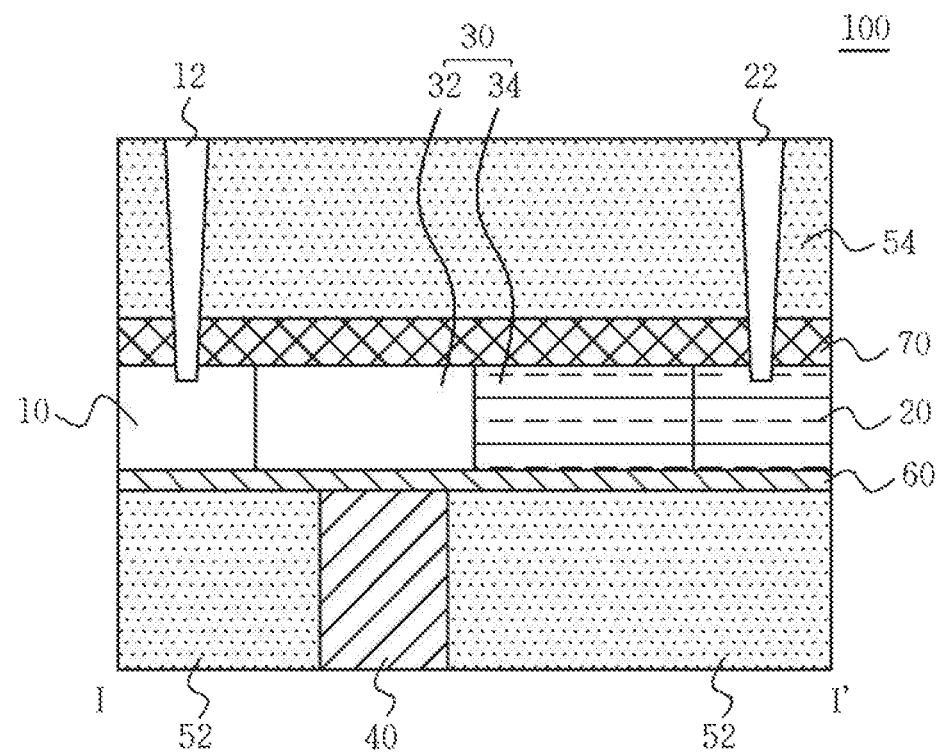
FIG. 16 is a cross-sectional view taken along the line of FIG. 15.

FIG. 15 is a top view to assist in the explanation of an e-fuse 100 of a semiconductor device in accordance with a sixth embodiment of the present disclosure. FIG. 16 is a cross-sectional view taken along the line I-I' of FIG. 15. A silicon nitride layer 70 and a second oxide layer 54 shown in FIG. 16 are not shown in the top view of FIG. 15 to facilitate the understanding of the structure of the present embodiment. As shown in FIG. 16, the silicon nitride layer 70 may be formed on a gate metal 30 and first and second electrodes 10 and 20, and the second oxide layer 54 may be formed on the silicon nitride layer 70, the semiconductor layer 40, the first oxide layer 52, and the gate oxide layer 60.

Referring to FIGS. 15 and 16, the e-fuse 100 includes first and second gate metals 32 and 34 which electrically couple the first and second electrodes 10 and 20 and are formed of different metals, the semiconductor layer 40 which is formed under the gate oxide layer 60 and positioned substantially centrally under the first gate metal 32 and forms a capacitor together with the first gate metal 32 and the gate oxide layer 60, and the first oxide layer 52 which is formed under the gate oxide layer 60 and disposed under the first and second electrodes 10 and 20, under the second gate metal 34 and on both sides of the semiconductor layer 40.

The first gate metal 32, the gate oxide layer 60, and the semiconductor layer 40 may form an n-type capacitor, and a program voltage may be applied to the second electrode 20 and a ground voltage may be applied to the semiconductor layer 40.

When a program voltage is applied to the second electrode 20 and the ground voltage is applied to the semiconductor layer 40, electro-migration, thermo-migration and melting phenomena are induced in the gate metal 30 by the program current, and as a result, capacitance or leakage current changes according to changes in the dielectric constant characteristics of the gate metal 30 and a gate oxide layer 60 may occur.

Figure 17:
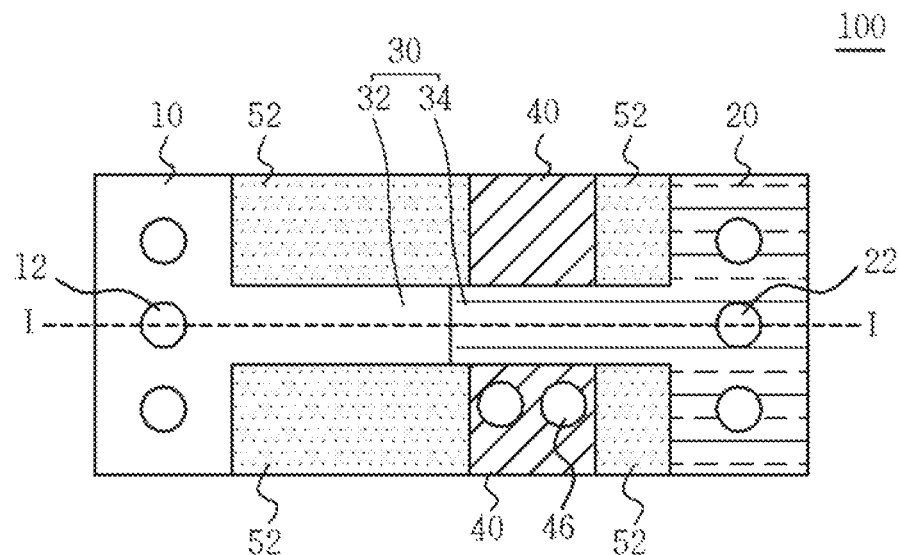
FIG. 17 is a top view to assist in the explanation of an e-fuse for use in a semiconductor device in accordance with a seventh embodiment of the present disclosure.
Figure 18:
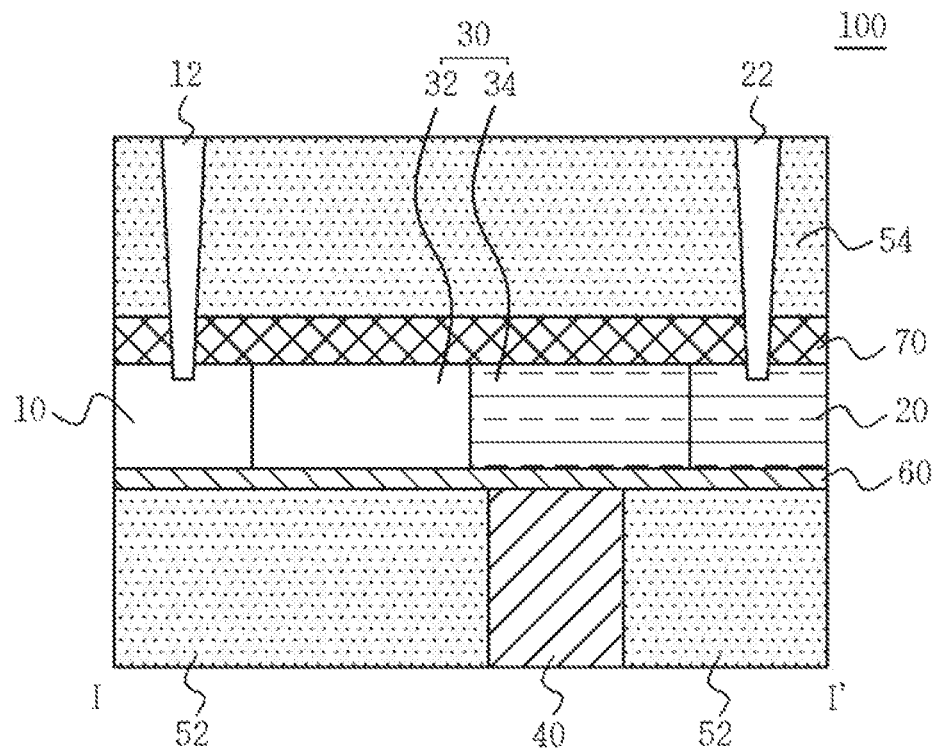
FIG. 18 is a cross-sectional view taken along the line I-I' of FIG. 17.

FIG. 17 is a top view to assist in the explanation of an e-fuse 100 of a semiconductor device in accordance with a seventh embodiment of the present disclosure. FIG. 18 is a cross-sectional view taken along the line of FIG. 17. A silicon nitride layer 70 and a second oxide layer 54 shown in FIG. 18 are not shown in the top view of FIG. 17 to facilitate the understanding of the structure of the present embodiment. As shown in FIG. 18, the silicon nitride layer 70 may be formed on a gate metal 30 and first and second electrodes 10 and 20, and the second oxide layer 54 may be formed on the silicon nitride layer 70, the semiconductor layer 40 and the first oxide layer 52.

Referring to FIGS. 17 and 18, the e-fuse 100 includes first and second gate metals 32 and 34 which electrically couple the first and second electrodes 10 and 20 and are formed of different metals, the semiconductor layer 40 which is formed under the gate oxide layer 60 and is positioned substantially centrally under the second gate metal 34 to form a capacitor together with the second gate metal 34, and the first oxide layer 52 which is formed under the gate oxide layer below the first and second electrodes 10 and 20, below the first gate metal 32 and on both sides of the semiconductor layer 40.

The second gate metal 34 and the semiconductor layer 40 may form a p-type capacitor, and a program voltage may be applied to the first electrode 10 and a ground voltage may be applied to the semiconductor layer 40.

When a program voltage is applied to the first electrode 10 and the ground voltage is applied to the semiconductor layer 40, electro-migration, thermo-migration and melting phenomena are induced in the gate metal 30 by program current, and as a result, capacitance or leakage current changes according to changes in the dielectric constant characteristics of the gate metal 30 and a gate oxide layer 60 may occur.

Although various embodiments have been described for illustrative purposes, it will be apparent to those skilled in the art that various changes and modifications may be made without departing from the spirit and scope of the invention as defined in the following claims.

What is claimed is:

1. An e-fuse for use in a semiconductor device, comprising:
   first and second electrodes;
   a gate metal electrically coupling first and second electrodes, wherein the gate metal includes a first gate metal extending from the first electrode and a second gate metal extending from the second electrode to be brought into contact with the first gate metal;
   a semiconductor layer formed under the gate metal forming a capacitor together with the gate metal, wherein one half of the semiconductor layer corresponding to the bottom of the first gate metal is formed into an n-type channel, and the other half of the semiconductor layer corresponding to the bottom of the second gate metal is formed into a p-type channel;
   a gate oxide layer formed between a bottom end of the gate metal and a top end of the semiconductor layer corresponding to the bottom end of the gate metal; and
   a first oxide layer formed under the gate metal and on both sides of the semiconductor layer,
   wherein the first gate metal and one half of the semiconductor layer form an n-type e-fuse, wherein the second gate metal and the other half of the semiconductor layer form a p-type e-fuse, and wherein the first gate metal is formed of one metallic material, and the second gate metal is formed of a plurality of layers of metallic materials different from the first gate metal.

2. The e-fuse for use in a semiconductor device according to claim 1, further comprising:
a silicon nitride layer formed over the gate metal; and
a second oxide layer formed over the silicon nitride layer, the semiconductor layer and the first oxide layer.

3. The e-fuse for use in a semiconductor device according to claim 1, further comprising first contacts for applying a program voltage to any one of the first and second electrodes, and second contacts for applying a ground voltage to the semiconductor layer.

* * * * *